United States Patent
Schade et al.

(10) Patent No.: US 11,914,341 B2
(45) Date of Patent: Feb. 27, 2024

(54) EXPOSURE STRATEGY IN MULTIPLE-BEAM AM SYSTEMS

(71) Applicant: EOS GmbH Electro Optical Systems, Krailling (DE)

(72) Inventors: Martin Schade, Munich (DE); Albert Fruth, Germering (DE); Robert Achim Domröse, Germering (DE); Maximilian Mittermüller, Munich (DE); Michael Göth, Munich (DE); Markus Kuchenbaur, Munich (DE); Michael Kowal, Munich (DE)

(73) Assignee: EOS GmbH Electro Optical Systems, Krailling (DE)

( * ) Notice: Subject to any disclaimer, the term of this patent is extended or adjusted under 35 U.S.C. 154(b) by 824 days.

(21) Appl. No.: 16/496,594

(22) PCT Filed: Mar. 7, 2018

(86) PCT No.: PCT/EP2018/055626
§ 371 (c)(1),
(2) Date: Sep. 23, 2019

(87) PCT Pub. No.: WO2018/172080
PCT Pub. Date: Sep. 27, 2018

(65) Prior Publication Data
US 2021/0114111 A1   Apr. 22, 2021

(30) Foreign Application Priority Data
Mar. 24, 2017   (DE) .......................... 102017205053.5

(51) Int. Cl.
*B33Y 10/00*   (2015.01)
*B33Y 30/00*   (2015.01)
(Continued)

(52) U.S. Cl.
CPC .......... *G05B 19/4099* (2013.01); *B22F 10/36* (2021.01); *B22F 10/80* (2021.01);
(Continued)

(58) Field of Classification Search
CPC .......... B22F 10/85; B22F 10/36; B22F 10/28; B33Y 10/00; B33Y 30/00; B33Y 50/00;
(Continued)

(56) References Cited

U.S. PATENT DOCUMENTS

2010/0233012 A1* 9/2010 Higashi ................... B22F 12/00
                                                                  419/9
2013/0055568 A1   3/2013 Dusel et al.
(Continued)

FOREIGN PATENT DOCUMENTS

DE   102010011059   9/2011
EP   2221132   8/2010
(Continued)

OTHER PUBLICATIONS

Stengel, Additive manufacturing apparatus and method for producing a three-dimensional work piece with multiple laser sub-beams from a spatial light modulator splitting a single laser source, 2019, google patents, machine translation of WO2019141381 (Year: 2019).*

(Continued)

*Primary Examiner* — Robert E Fennema
*Assistant Examiner* — Yvonne Trang Follansbee
(74) *Attorney, Agent, or Firm* — Polsinelli

(57) ABSTRACT

The invention relates to a computer-assisted method for generating a control data set for an additive layer manufacturing device. In a first step, a layer data set is accessed, wherein points are marked in the data model which correspond to an object cross-section and at which the bid-up material should be solidified. In a second step, the layer data set is modified in such a way that for at least a portion of the (Continued)

object cross-section, the number of beams required for solidifying the build-up material inside said portion is determined preferably automatically, according to quality specifications of the portion and/or a manufacturing time of the object. In a third step, the modified layer data set is provided as a control data set for the additive layer manufacturing device.

13 Claims, 10 Drawing Sheets

(51) Int. Cl.
| | |
|---|---|
| B33Y 50/02 | (2015.01) |
| B23K 26/342 | (2014.01) |
| B29C 64/153 | (2017.01) |
| B22F 10/36 | (2021.01) |
| B29C 64/386 | (2017.01) |
| B33Y 50/00 | (2015.01) |
| B22F 10/80 | (2021.01) |
| B22F 10/85 | (2021.01) |
| B22F 10/28 | (2021.01) |
| B22F 12/13 | (2021.01) |
| B22F 12/41 | (2021.01) |
| B22F 12/45 | (2021.01) |
| B22F 10/366 | (2021.01) |
| G05B 19/4099 | (2006.01) |

(52) U.S. Cl.
CPC .......... *B23K 26/342* (2015.10); *B29C 64/153* (2017.08); *B29C 64/386* (2017.08); *B33Y 10/00* (2014.12); *B33Y 30/00* (2014.12); *B33Y 50/00* (2014.12); *B33Y 50/02* (2014.12); *B22F 10/28* (2021.01); *B22F 10/366* (2021.01); *B22F 10/85* (2021.01); *B22F 12/13* (2021.01); *B22F 12/41* (2021.01); *B22F 12/45* (2021.01); *G05B 2219/49013* (2013.01); *G05B 2219/49018* (2013.01)

(58) Field of Classification Search
CPC ..... B33Y 50/02; B23K 26/342; B29C 64/153; B29C 64/386; G05B 19/4099; G05B 2219/49013; G05B 2219/49018
See application file for complete search history.

(56) References Cited

U.S. PATENT DOCUMENTS

| | | | |
|---|---|---|---|
| 2015/0273769 A1* | 10/2015 | Korn | B29C 64/153 264/405 |
| 2016/0318129 A1 | 11/2016 | Hu | |
| 2018/0017958 A1* | 1/2018 | Kinoshita | G05B 19/4099 |
| 2018/0193955 A1* | 7/2018 | Karp | B29C 64/153 |
| 2018/0272611 A1* | 9/2018 | Cantzler | B29C 64/245 |
| 2021/0197487 A1* | 7/2021 | Ge | B29C 64/112 |

FOREIGN PATENT DOCUMENTS

| | | |
|---|---|---|
| EP | 2926979 | 10/2015 |
| WO | 2016077250 | 5/2016 |
| WO | 2016110440 | 7/2016 |
| WO | WO-2019141381 A1 * | 7/2019 |

OTHER PUBLICATIONS

International Search Report for Application No. PCT/EP2018/055626 dated Jul. 19, 2018, 3 pages.

* cited by examiner

EXPOSURE STRATEGY IN MULTIPLE-BEAM AM SYSTEMS

TECHNICAL FIELD OF THE INVENTION

The invention refers to a device and a computer-based method of generating a control dataset for a layer-wise additive manufacturing apparatus.

BACKGROUND OF THE INVENTION

Layer-wise additive manufacturing apparatus and corresponding methods are generally characterized in that objects are manufactured in them layer by layer by means of a solidification of a shapeless building material. For example, the solidification can be effected by means of a supply of heat energy to the building material by irradiating the same with electromagnetic radiation or particle radiation (e.g. laser sintering (SLS) or laser melting or electron beam melting) or else by effecting a cross-linking reaction in the building material (e.g. stereolithography). The devices and methods that were originally used in prototyping more and more are used for a series production, for which the term "additive manufacturing" has become common.

In particular in additive manufacturing, it is important that objects are manufactured not only with high precision but also within a short manufacturing time. Here, the manufacturing time can be lowered by simultaneously using a plurality of energetic beams, e.g. laser beams, for a solidification of the positions in a layer corresponding to one or more object cross-sections.

WO 2016/110440 A1 describes a corresponding device in which different laser beams are assigned to different regions of a layer, wherein there are regions in which several beams can act on the building material, i.e. regions onto which not only one laser beam but a plurality of laser beams can be directed.

In FIG. 12 this approach is illustrated by means of a construction field onto which four laser beams can act simultaneously. In the construction field 8 in FIG. 12, the regions in which only one of the four laser beams can be used for the solidification are labelled with A1 to A4. Regions in which two laser beams can be used together for the solidification are labeled with the letter "B", wherein the numbers following the letters indicate which one of the four laser beams (numbered with 1 to 4) is used. Finally, there is a central region C1234 in which all four laser beams can be used together for the solidification of one or more cross-sections in this region.

WO 2016/110440 A1 deals with the problem that it must be coordinated which of the laser beams that can be used in a common region shall be directed to a specific position in this region. In particular, the coordination can be made in such a way that a laser beam having in its operating area only few positions to be solidified in a layer can be used in a neighboring operating area in which many positions have to be solidified.

The inventors have found that in the boundary region of operating zones of different laser beams such as in the region B12 in FIG. 12 at the boundary line G between the region B121 that is solidified by laser beam 1 and the region B122 that is solidified by laser beam 2, the melting behavior and solidification behavior, respectively, of the building material are slightly different than in other regions. In particular, the inventors could ascertain that small inhomogeneities of the part properties occur at the boundary line, e.g. deteriorated mechanical parameters. Though the manufacturing time can be considerably lowered by the use of a plurality of laser beams, the inventors have found that quality losses for the manufactured objects have to be expected when using a plurality of laser beams.

SUMMARY OF THE INVENTION

In view of the above-described problem, it is an object of the present invention to provide an improved method and an improved device for a manufacture of objects by means of a generative manufacturing method, in particular an additive manufacturing method.

The object is achieved by means of a computer-based method according to claim 1, a layer-wise additive manufacturing method according to claim 13, a device for a computer-based generation of a control dataset according to claim 14 and a computer program according to claim 15. Further developments of the invention are claimed in the dependent claims. In particular, a device according to the invention can be developed further also by features of the methods according to the invention characterized further below and by features characterized in the dependent claims, respectively, and vice-versa. Moreover, the features described in connection with one device may also be used for a further development of another device according to the invention, even if this is not explicitly stated.

An inventive computer-based method of generating a control dataset for a layer-wise additive manufacturing apparatus for manufacturing a three-dimensional object by means of the same, wherein the manufacture comprises the steps:

a manufacture of the object layer by layer and a controlled directing of radiation of at least one radiation source onto areas of a layer of building material that correspond to an object cross-section by means of an input device, wherein the input device is configured to direct a plurality of beams to different regions of an applied layer, each beam where it impinges on the layer acting on the building material, in particular such that the same is solidified, comprises:

a first step of accessing a layer dataset containing a data model of a building material layer to be selectively solidified during the manufacture, wherein in said data model positions corresponding to an object cross-section are marked, at which positions a solidification of the building material shall be carried out, characterised in that in a second step the dataset is modified such that for at least one portion of the object cross-section the number of beams by means of which the building material within this portion is to be solidified is, preferably automatically, specified depending on specifications for a quality of said portion and/or on a manufacturing time for the object and in a third step the modified layer dataset is provided as control dataset for the layer-wise additive manufacturing apparatus.

Here, the radiation source may for example be a laser or an electron beam source. However, one could also think of a device in 3D printing that generates a binding material beam (even if in this connection the term "radiation" is uncommonly used) or a UV light source in stereolithography. The term "beam" shall express the fact that it does not only refer to rays which have a small and circular, respectively, cross-section when impinging on the building material, but also rays that e.g. have a line-shaped cross-section or even radiation that is simultaneously input into a larger area of the building material (meaning areally).

Here, a layer dataset is considered to be a dataset that contains a data model of a building material layer to be solidified during the manufacturing method at the positions of an object cross-section. In particular, such a data model includes a two-dimensional representation of the object cross-section to be solidified in a layer by means of one or more beams. In the layer dataset there may be, but need not be, included further information with respect to the manufacturing of the object cross-section such as the layer thickness, the diameter of a beam impinging on the building material, etc. When it is referred to an access to a layer dataset, this means that a layer dataset is read from a memory or that data corresponding to the layer dataset are received via a network.

By the inventive approach, a manufacturing process is automatically adapted to the quality and/or velocity specifications for individual or all portions of an object cross-section. The quality of a manufactured object and object portion, respectively, is influenced by many boundary conditions of the manufacture: The condition of the building material, the existing ambient parameters (e.g. a temperature or temperature distribution in the construction space), technical peculiarities of the layer-wise additive manufacturing apparatus (e.g. variations in the optical properties of the beam-shaping optics and/or the size and shape, respectively, of an area of incidence of a beam and/or of an energy distribution across an area of incidence of a beam within the construction field), etc. Here, the inventors of the present application have found that also the number of beams that is used for a solidification of an object cross-section has an influence on the quality.

The term "quality" as it is understood in the present application describes the spread of properties, e.g. the density, of an object, in other words to which degree an object property varies across the object. In fact, object properties always vary in reality. However, in the case of a high quality, a desired object property will vary across the object or from object to object only to a small degree. In the case of a low quality, the desired property will strongly vary so that in the end there is a reduced control of the property, meaning e.g. a control of the specific value the density has. A quality can be specified by the specification of one or more quality indicators to which values are assigned that are considered to be a measure for the quality, e.g. limit values for specific object properties or process parameters that characterize the manufacturing process by means of a layer-wise additive manufacturing apparatus. Here, examples for object properties are mechanical parameters such as tensile strength, breaking strength, the porosity of the solidified building material, the microstructure, meaning in particular the crystalline structure, the impurity level in the material, parameters related to the surface constitution such as the roughness or even the color of the solidified building material.

The quality of a manufactured object and object portion, respectively, in the sense of the present invention can be regarded as homogeneity of the manufactured object and object portion, respectively. In the context of the invention, a high homogeneity is associated with a high quality. Here, homogeneity means that variations of object properties (in particular abrupt changes) remain below a predetermined limit with respect to their absolute values or statistical variations. For example, this can mean that abrupt changes of specific properties within a manufactured object or else from object to object (for several objects manufactured in parallel), which abrupt changes can occur though the corresponding control data of the layer-wise additive manufacturing apparatus are held constant, will very probably not exceed a certain extent. As there are instrument-based variations for every solidification beam (e.g. variations of the beam diameter when impinging on the building material, etc.), it is immediately apparent that a small number of solidification beams that is used will lead to a larger homogeneity of properties. Moreover, for a smaller number of solidification beams, e.g. laser beams, that is used, there will of course also be fewer boundary regions between the operating zones of the different solidification beams. As in practice there are always slightly different beam parameters for different solidification beams, e.g. an offset of scanlines, different irradiation incidence angles etc., abrupt changes of e.g. mechanical properties or of a surface constitution of the object will occur at an increased extent particularly in the boundary regions. Therefore, the fewer solidification beams are used the more homogeneous is the manufactured object or a portion of the same in its properties. Also, the dimensional accuracy is the better the fewer boundary regions exist.

According to the invention, for the predetermined boundary conditions (quality and manufacturing time) the best possible number of solidification beams to be used is automatically chosen. Thus, also for a target manufacturing time that has been specified to be as short as possible, quality losses can be prevented. In particular, it is thereby possible to manufacture with a high quality (or homogeneity) only in predetermined portions in which this is held to be necessary, while in other portions the time needed for a solidification of the building material is minimized. Thus, an individual reaction to existing requirements for the manufacture of a specific object is possible.

In particular, it shall also be mentioned that even when the best possible number of solidification beams to be used is chosen, there is no guarantee that the specified homogeneity of the manufactured object and object portion, respectively, can actually be achieved in its manufacture. As was already mentioned, there are many parameters that affect the quality and homogeneity, respectively, of an object to be manufactured. Thus, instrument-based parameters may vary during the manufacture and may lead to inhomogeneities in the construction space and construction process, respectively, and, as a result thereof, may lead also to inhomogeneities of properties of a manufactured object. However, by the inventive approach a user of the inventive method rules out that the homogeneity of the object and object portion, respectively, to be manufactured will be worse than desired though all other parameters having an influence on the homogeneity are optimal. By the inventive approach, the risk of inhomogeneities is lowered and by the specification of a quality (or homogeneity), a user in fact specifies a tolerable inhomogeneity risk and an inhomogeneity risk level, respectively.

Furthermore, as soon as the number of solidification beams has been specified, the respective exposure strategies for the corresponding solidification beams may be specified in addition. This means e.g. a specification of the partial regions of an object portion that are assigned to the individual solidification beams and/or a specification of the respective temporal and spatial pattern with which the solidification beams are moved over the partial regions assigned to them.

In a modification of the inventive method, in the first step a layer dataset is accessed that contains a data model in which positions corresponding to the cross-sections of a plurality of objects in the respective building material layer are marked, at which positions a solidification of the building material shall be carried out. In the second step, the layer dataset is then modified such that for at least two portions that are assigned to cross-sections of different objects the number of beams by means of which the building material within each of these portions is to be solidified is, preferably automatically, specified depending on specifications for a quality of the portion and/or a manufacturing time for the object.

In the just described modification of the inventive method, quality specifications can be taken into account in situations in which a plurality of objects is manufactured in parallel in a layer-wise additive manufacturing apparatus, wherein the quality is rated based on the variation of properties from object to object. The variants of the inventive approach that are described in this application can be applied in the just described modification.

Preferably, in the method in a further step that is inserted between the second step and the third step the layer dataset is modified in consideration of the specification according to the second step such that for each of the positions corresponding to said portion it is specified by means of which beam the building material at this position is to be solidified. For a simplified manufacturing process it is advantageous to make this specification already in advance when the number of beams to be used is specified. In particular, this specification can be integrated in the second step.

Further preferably, in said method a control dataset is generated for a layer-wise additive manufacturing apparatus that is configured to direct n beams simultaneously onto a building material layer, wherein n is a natural number larger than one. A manufacturing time that is as short as possible can be achieved in particular with layer-wise additive manufacturing apparatus in which a solidification is carried out simultaneously with a plurality of beams. The method is particularly preferably applied in conjunction with a layer-wise additive manufacturing apparatus that is configured such that four beams can be simultaneously directed to a layer of the building material.

The use of a large number of beams on the one hand is highly demanding with regard to the coordination of the different beams and on the other hand leads to considerably higher costs of the layer-wise additive manufacturing apparatus if a plurality of radiation sources is used. Here, the possibility to use four beams simultaneously in the layer-wise additive manufacturing apparatus is a good compromise between achievable manufacturing times and the costs of the device.

Preferably, the specifications for a quality of said portion and/or a manufacturing time of the object are input by a user input at an input terminal, in particular a graphical user interface. A user is thereby able to specify individually for an object to be manufactured, which portions of an object cross-section need to have a high homogeneity and which specifications are made with regard to the building time (=manufacturing time).

In particular, there is the possibility that by a user input at an input terminal, in particular a graphical user interface, a user selects one of n predefined successive quality or homogeneity levels in order to specify the quality. Here, n is a natural number larger than one and preferably, however not necessarily, corresponds to the number of existing beams in the layer-wise additive manufacturing apparatus. Moreover, it is assumed that the specified quality levels or homogeneity levels are subject to an order relation and all are different from one another. On the one hand, the specification of discrete homogeneity levels makes the handling easier and on the other hand it makes the adaptability of the inventive method to a given layer-wise additive manufacturing apparatus easier.

In particular, one can proceed such that for a highest quality level that is specified by a user for a portion of an object cross-section, it is specified in the second step that the building material within this portion has to be solidified with only one beam and/or for a lowest quality level that is specified by a user for a portion of an object cross-section, it is specified in the second step that the building material within this portion has to be solidified with the maximum number of available beams and/or for a medium quality level that is specified by a user for a portion of an object cross-section, it is specified in the second step that the building material within this portion has to be solidified with a number of beams that is larger than one and smaller than the maximum number of beams, wherein consistently for a higher quality level the respective number of beams to be used is smaller or the same than the number of beams to be used for a lower quality level.

Here, the approach is based on the idea that with an increasing number of beams that is concertedly used in a portion for a solidification also the number of boundary regions increases and accordingly the homogeneity is decreased. By the described approach there is a direct correlation between the specified homogeneity for a portion of an object cross-section and the number of beams that is used in this portion for a solidification. The number of beams to be used decreases monotonically with an increasing homogeneity level. Particularly, when the number of specified homogeneity levels equals the number of beams that can be used together in the layer-wise additive manufacturing apparatus, the number of beams that is actually used for the solidification of a portion can be selected to be inversely proportional to the specified homogeneity level.

Preferably, in addition to a quality of a portion of an object cross-section or a number of portions of an object cross-sections a manufacturing time for the manufacture of the object is specified by the user and an error message is output to the user, in particular via a graphical user interface, if the specified quality or homogeneity and the specified manufacturing time are incompatible with one another, i.e. are not achievable at the same time. A user thereby receives already before the start of a manufacturing process an information that with the intended boundary conditions (homogeneity and manufacturing time) a manufacturing of the object is not possible. Thus, costs can be saved as futile attempts to manufacture the object with incompatible boundary conditions are avoided.

Further preferably, specifications for a quality of an object to be manufactured are derived from information contained in the layer dataset, in particular a level of detail of a data model of an object to be manufactured, a shape of individual object cross-sections and/or a way in which radiation is supplied to the building material and/or a type and/or a composition of the building material. The method can thereby proceed independently without the need of further inputs by a user. However, it is of course also conceivable that information in the layer dataset is accessed and also additional specifications by the user (for example the specification of a maximum manufacturing time) are taken into account for the specification in the second step.

Further preferably, in the second step specifications for a portion of the object to be manufactured, in particular for the whole object to be manufactured, are taken into consideration. When the homogeneity and/or manufacturing time are specified not only for a portion of an object cross-section but for a whole object cross-section, a portion of an object spanning parts of several object cross-sections or even for the whole object, simplifications can result insofar as specifications then need not be made for many individual portions of object cross-sections but only for larger partial regions of an object. The specification of the number of beams to be used for the solidification will then depend on the fact, whether the region to be solidified is located within said object partial region (for which e.g. a high homogeneity was specified) or not.

Further preferably, a user only specifies a manufacturing time for the manufacture of the object and a quality level to be expected for the object to be manufactured is output to the user, which quality level would be obtained for a manufacture within the specified manufacturing time. For such an approach e.g. at first the number of beams for solidifying is determined in order to be able to comply with the specified (maximum) manufacturing time. Based on the number of beams to be concertedly used for the solidification of a portion, then the expected homogeneity is estimated and a homogeneity level resulting from the estimation is output to the user. A user thereby gets an information on the homogeneity to be expected already before the start of a manufacturing process, so that unnecessary manufacturing processes can be avoided (as the homogeneity to be expected possibly would be not acceptable).

In a further variant of the inventive approach, the user only specifies a quality or homogeneity and a manufacturing time to be expected for the manufacture of the object will be output to the user, which manufacturing time is to be expected for the manufacture of the object with the specified quality or homogeneity. The resulting advantages are the same as those described in the preceding paragraph.

In an advantageous modification of the inventive method, in at least one portion, for which a solidification with a plurality of beams has been specified in the second step, several abutting partial cross-sections, meaning partial regions of this portion that are to be solidified, are specified, wherein for each of these partial cross-sections it is specified, with which beam the positions in this partial cross-section are to be solidified, wherein the partial cross-sections are specified such that a boundary region, meaning a region that is located at the boundary between different partial cross-sections, differs in its shape and/or position in the layer plane from the shape and/or position of a boundary region in a layer dataset assigned to the immediately preceding or immediately following layer. Non-uniformities in the solidification of the building material that may occur in a manufactured object in larger contiguous regions at the boundaries between the operating areas of different solidification beams can for example be avoided thereby. Thus, the mechanical parameters (e.g. the elongation at break) for the manufactured object are better. Also, for example a bulge formation at the object surface as it may occur due to boundaries between operating areas that lie over each other in several layers can be avoided.

An inventive layer-wise additive manufacturing method for the manufacture of at least one three-dimensional object by means of a layer-wise additive manufacturing apparatus, wherein the manufacture comprises the steps:

a manufacture of the object layer by layer and
a controlled directing of radiation of at least one radiation source onto areas of an applied layer of building material that correspond to an object cross-section by means of an input device,
wherein the input device is configured to direct a plurality of beams to different regions of the applied layer, each beam where it impinges on the layer acting on the building material, in particular such that the same is solidified,
wherein the layer-wise additive manufacturing method uses for the manufacture a control dataset that has been generated by a method of generating a control dataset according to one of the preceding claims. Thus, a manufacturing process can be optimized with regard to the manufacturing time and quality or homogeneity of an object to be manufactured, for example by applying the inventive method for a generation of a control dataset before the start of the manufacturing process, in particular before the application of the first building material layer is executed, and by controlling the manufacturing process by a control command set that contains a control dataset provided by the inventive method of generating a control dataset.

In particular, the inventive method of generating a control dataset can be carried out during the manufacture of the three-dimensional object, so that the boundary conditions for the solidification can be dynamically specified for optimizing the homogeneity and manufacturing time.

An inventive layer-wise additive manufacturing apparatus contains a control device that controls a manufacturing process of an object by using a control dataset generated by an inventive method.

An inventive device for a computer-based generation of a control dataset for a layer-wise additive manufacturing apparatus for manufacturing a three-dimensional object by means of the same, wherein the manufacture comprises the steps:

a manufacture of the object layer by layer,
a controlled directing of radiation of at least one radiation source onto areas of an applied layer of building material that correspond to an object cross-section by means of an input device,
wherein the input device is configured to direct a plurality of beams to different regions of the applied layer, each beam where it impinges on the layer acting on the building material, in particular such that the same is solidified,
wherein the device for a computer-based generation of a control command dataset comprises:
an access unit that is adapted to access a layer dataset containing a data model of a building material layer to be selectively solidified during the manufacture, wherein in said data model positions corresponding to an object cross-section are marked, at which positions a solidification of the building material shall be carried out,
characterized by a specification unit that is adapted to modify the layer dataset such that for at least one portion of the object cross-section the number of beams by means of which the building material within this portion is to be solidified is, preferably automatically, specified depending on specifications for a quality of said portion and/or on a manufacturing time for the object and
a provision unit that is adapted to provide the modified layer dataset as control dataset for the layer-wise additive manufacturing apparatus.

In particular, the inventive device for generating a control dataset is suitable for carrying out any of the variants of the inventive method of generating a control dataset. The mentioned access unit can be an input interface that is able to read data from a mobile data carrier or to receive data via a network or else reads data directly from a memory. In particular, the inventive device can be implemented not only as separate unit but can be a component of a larger data processing system (such as a CAD design system) or else can be integrated in a layer-wise additive manufacturing apparatus. In both last mentioned cases, the access unit preferably is a software interface communicating with other system components. In particular, the inventive device need not mandatorily be a component of a layer-wise additive manufacturing apparatus. This is advantageous as possibly layer datasets for an object to be processed are not present at the location of the layer-wise additive manufacturing apparatus but are located where the object to be processed was designed. Moreover, the access unit may also access layer datasets that are stored in a memory located in the device according to the invention.

On the other hand, a close coupling of the inventive device for generating a control dataset to a layer-wise additive manufacturing apparatus for which the control dataset is generated is advantageous as then it can quickly be reacted to technical boundary conditions (e.g. changing process parameters such as the construction space temperature, etc.) inherent to the layer-wise additive manufacturing apparatus.

Preferably, the device according to the invention additionally contains a data modification unit that is configured to mark in the layer dataset modified by the specification unit for each of the positions corresponding to the portion with which beam the building material is to be solidified at this position. In order to be able to carry out a manufacturing process in a layer-wise additive manufacturing apparatus, it is necessary to eventually specify which beam shall be directed to a position of a layer. For a simplified process in the manufacture it is advantageous to make this specification already in advance, e.g. when specifying the number of beams to be used. In particular, the data modification unit can be integrated in the specification unit.

An inventive computer program having program code means to perform all steps of an inventive method of generating a control dataset or an inventive layer-wise additive manufacturing method when the computer program is executed by a data processor, in particular a data processor interacting with a layer-wise additive manufacturing apparatus. "Interacting" means here that the data processor either is integrated in the layer-wise additive manufacturing apparatus or is able to exchange data with it.

The implementation of the inventive method of generating a control dataset and of the respective device by means of software makes an easy installability on different computing systems at different locations possible (for example at the creator of the design of the object to be processed or else at the operator of the layer-wise additive manufacturing apparatus).

BRIEF DESCRIPTION OF THE DRAWINGS

Further features and practicalities of the invention will arise from the description of embodiments based on the attached drawings.

DETAILED DESCRIPTION OF THE EMBODIMENTS

Figure 1:
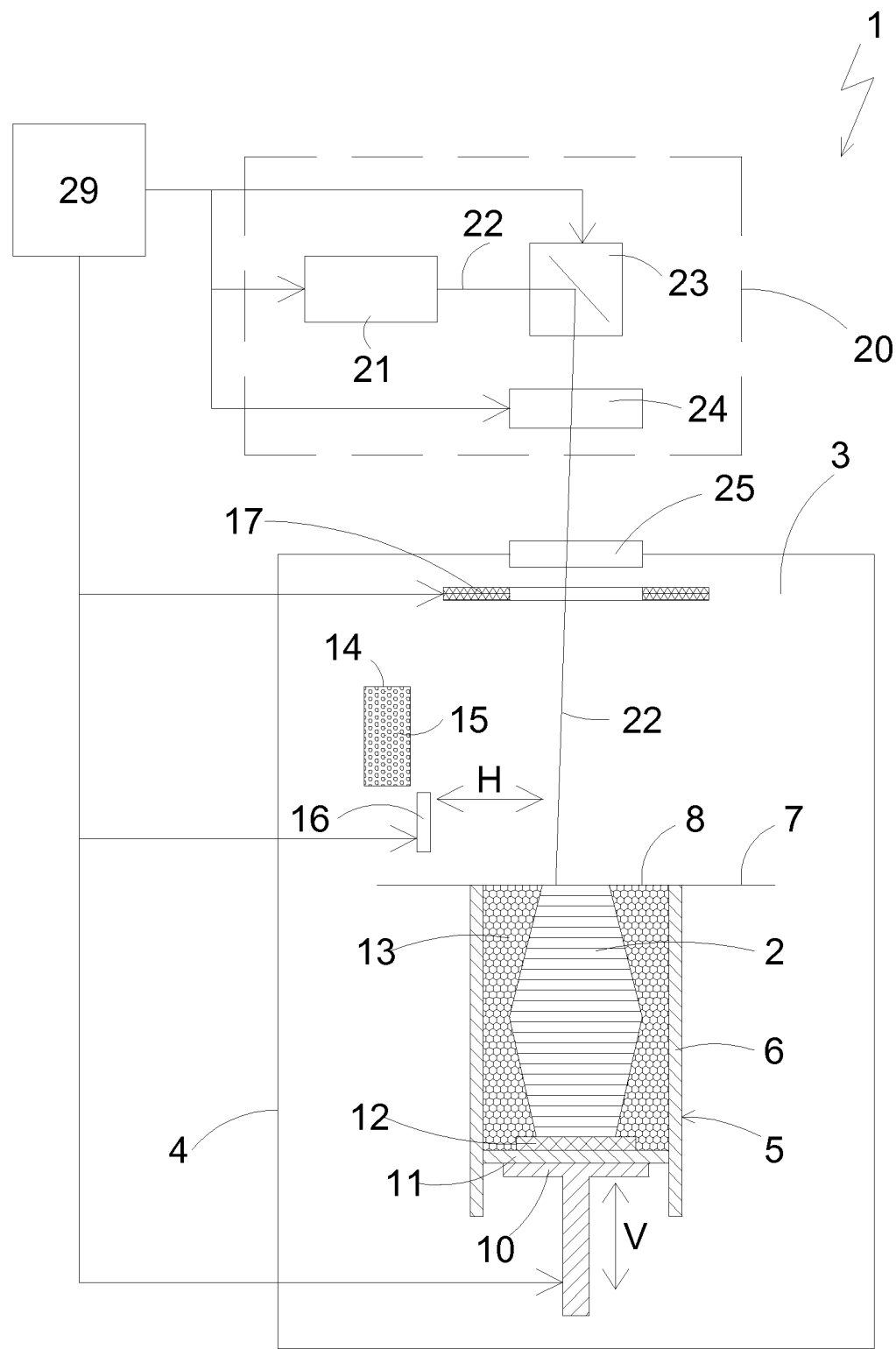
FIG. 1 shows a schematic, partially cross-sectional view of an exemplary device for an additive manufacturing of a three-dimensional object according to an embodiment of the invention.

In the following, for a description of the method according to the invention, at first a layer-wise additive manufacturing device according to the invention shall be described using a laser sintering or melting device as example by making reference to FIG. 1. At this point it shall be remarked that in the present application the term "a number of" is always to be understood as meaning "one or more". Further, it shall be remarked that by means of the inventive layer-wise additive manufacturing apparatus not only one object, but also a plurality of objects can be manufactured at the same time, even in cases in which reference is made to only one object.

For the construction of an object 2, the laser sintering or melting device 1 comprises a process chamber or building chamber 3 having a chamber wall 4.

A container 5 open to the top having a container wall 6 is arranged in the process chamber 3. A working plane 7 is defined by the upper opening of the container 5, wherein that area of the working plane 7 that is located within the opening and can be used for the construction of the object 2, is designated as build area 8.

A support 10 that can be moved in a vertical direction V is arranged in the container 5. A base plate 11 is attached to the support 10, which base plate 11 closes the container 5 at the bottom and thus forms its bottom. The base plate 11 can be a plate that has been formed separately from the support 10 and is fixed to the support 10 or it can be integrally formed with the support 10. Depending on the powder that is used and on the process, a construction platform 12 as construction base can be attached to the base plate 11, on which construction platform 12 the object 2 will be constructed. However, the object 2 can also be built on the base plate 11 itself which then serves as construction base. In FIG. 1, the object 2 to be formed in the container 5 on the construction platform 12 is shown below the working plane 7 in an intermediate state with several solidified layers surrounded by building material 13 that remained unsolidified.

The laser sintering device 1 further comprises a storage container 14 for a building material 15 in powder form that can be solidified by means of electromagnetic radiation and a recoater 16 that can be moved in a horizontal direction H for applying the building material 15 within the build area 8. Optionally, a radiant heater 17 is arranged in the process chamber 3, which serves for heating the applied building material 15. As radiant heater 17 an infrared radiator can be provided, for example.

The laser sintering device 1 further comprises an exposure device 20 having a laser 21 that generates a laser beam 22 which is deflected by means of a deflection device 23 and is focused onto the working plane 7 by means of a focusing device 24 through a coupling window 25 arranged at the top side of the process chamber 3 in the chamber wall 4.

Furthermore, the laser sintering device 1 comprises a control unit 29 by which the individual components of the device 1 can be controlled in a coordinated manner in order to carry out the construction process. Alternatively, the control unit can also be arranged in part or completely outside of the device. The control unit can comprise a CPU, the operation of which is controlled by a computer program (software). The computer program can be stored separately from the device on a storage medium from which it can be loaded into the device, in particular into the control unit.

In operation, the support 10 is lowered layer by layer by means of the control device 29, the recoater 16 is controlled such that a new powder layer is applied and the deflection device 23 and, if necessary, also the laser 21 and/or the focusing device 24 are controlled such that the respective layer is solidified at the positions corresponding to the respective object by means of the laser by scanning these positions with the laser.

In laser sintering or laser melting, an exposure device may for example comprise one or more gas or solid-state lasers or any other laser types such as laser diodes, in particular VCSEL (Vertical Cavity Surface Emitting Laser) or VECSEL (Vertical External Cavity Surface Emitting Laser) or a line of these lasers. In general, instead of a laser, any device can be used by which energy can be selectively applied as electromagnetic radiation or particle radiation to a building material layer. For example, another light source, an electron beam or any other energy or radiation source that is suited to solidify the building material can be used instead of a laser. Therefore, the specific setup of a laser sintering or laser melting device shown in FIG. 1 is only by way of example and may of course be modified, in particular when using another exposure device than the ones presented.

Even if in FIG. 1 a laser sintering or laser melting device has been described as example of a layer-wise additive manufacturing apparatus, the invention is not limited to laser sintering or laser melting. It can also be applied in connection with other methods of additive manufacturing of a three-dimensional object by a layer-wise application and selective solidification of a building material. Here, only by way of example laser melting, FLM (application of a thermoplastic material from a nozzle), 3D printing, mask sintering methods and stereolithographic methods are mentioned. In case it is not a laser sintering method or laser melting method, the exposure device 20 is replaced by another input device depending on the method, in the case of a 3D printing method a device that sprays one or more binding material beams onto the building material, in the case of a stereolithography method a UV light source. In all cases, the input device comprises any type of radiation source from which at least one beam impinging on the building material is directed. Here, the present idea of the invention can be most advantageously implemented in conjunction with a layer-wise additive manufacturing apparatus, in which an input device is configured such that it can direct a plurality of rays or beams onto a region of a building material layer. For example, a layer-wise additive manufacturing apparatus to which the invention refers comprises a plurality of radiation sources 21, wherein preferably but not necessarily to each ray or beam is assigned its own radiation source. Merely out of reasons of a better clarity only one single exposure device 20 having a single radiation source 21 and a single ray 22 is shown in FIG. 1.

Even if in the further course of the description of the invention reference is made to a laser sintering device or laser melting device, this is done only by way of example and the explanations do correspondingly apply also to layer-wise additive manufacturing apparatus of other types outlined just before.

Different materials can be used as building material in a layer-wise additive manufacturing method, preferably powders or pastes and gels, respectively, in particular metal powders but also plastic powders, ceramic powders or sand, wherein also the use of filled or mixed powders is possible. In particular in stereolithography, (liquid) photopolymers are used.

In the layer-wise additive manufacturing apparatus just described by way of example, a manufacturing process proceeds such that the control unit 29 processes a control command set, which are instructions to subsequently apply layers of the building material and to selectively irradiate regions of the respective layers that correspond to the cross-section of an object to be manufactured with the laser radiation in order to solidify the building material. Thus, the control command set contains information on the positions to be solidified within a layer as well as on the way in which the object to be manufactured is sectioned into layers.

In detail, the control command set is based on a computer-based model of the object(s) to be manufactured, preferably a CAD volume model. Furthermore, also manufacture-specific information is integrated into the control command set, for example the position and orientation of the objects in the container 5 or a beam diameter when a laser beam impinges on the building material. Finally, also the layer information is contained in the control command set, meaning in which way the object(s) to be manufactured is sliced into layers that correspond to the building material layers during the layer-wise additive manufacturing. For each building material during the manufacture, the control command set specifies in particular the thickness of the layer application and the positions at which by supply of radiation a solidification of the building material shall be effected. Thus, the control command set can be regarded as the entirety of control data specified for the control of the manufacturing process in a layer-wise additive manufacturing apparatus. The control data related to a single layer here are also designated as layer dataset. In particular, the control command set also contains all data necessary for the control of the exposure device, whereby a.o. the energy density of the radiation emitted from the exposure device and the velocity of movement of the beam across the construction field 8 are specified if necessary.

In the following, the inventive approach will be exemplarily described by making reference to the figures.

Figure 2:
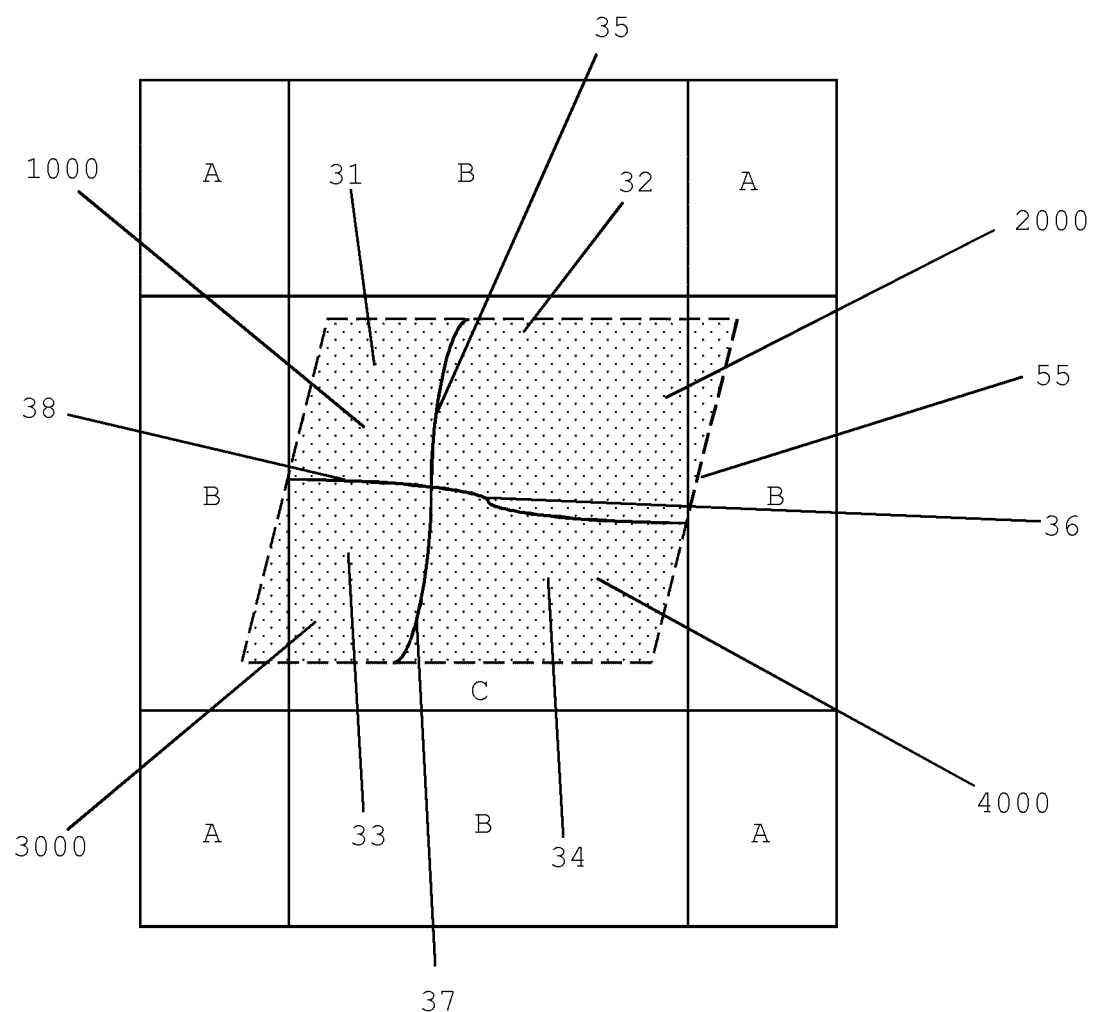
FIGS. 2 and 3 in each case show a schematic top view of a partial region of the construction field of a layer-wise additive manufacturing apparatus for an explanation of the approach according to the invention.
Figure 3:
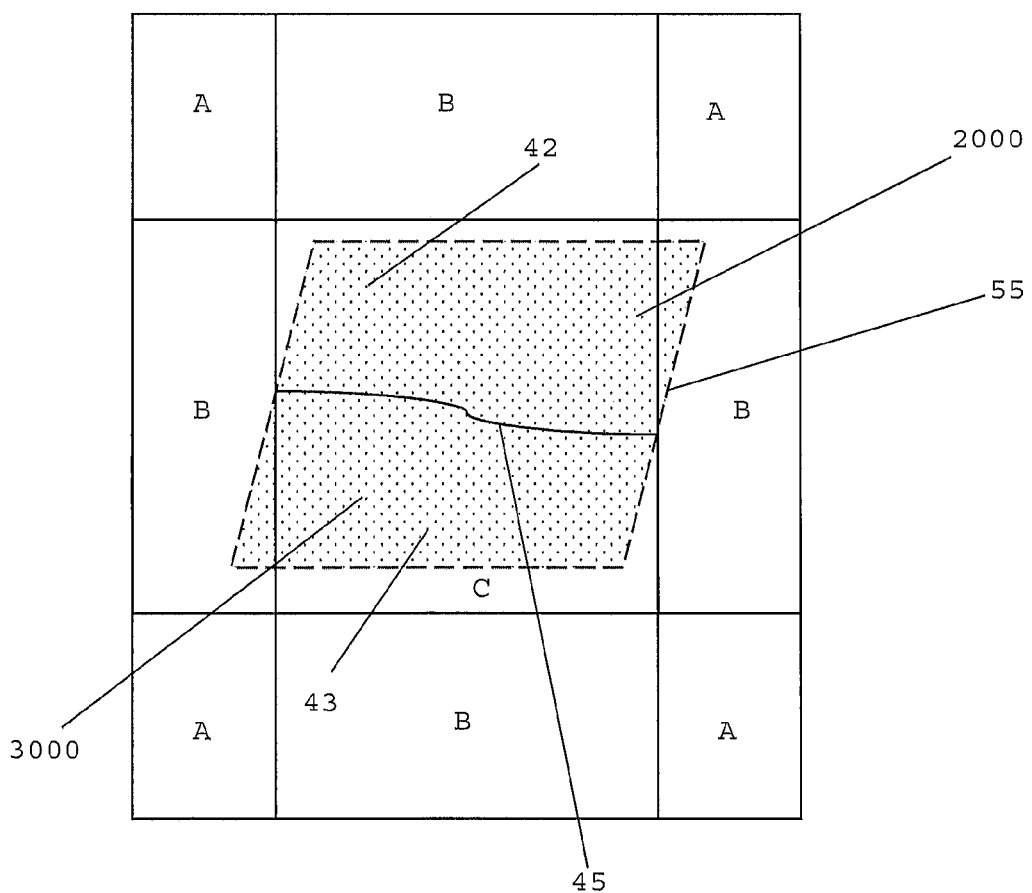
Figure 4:
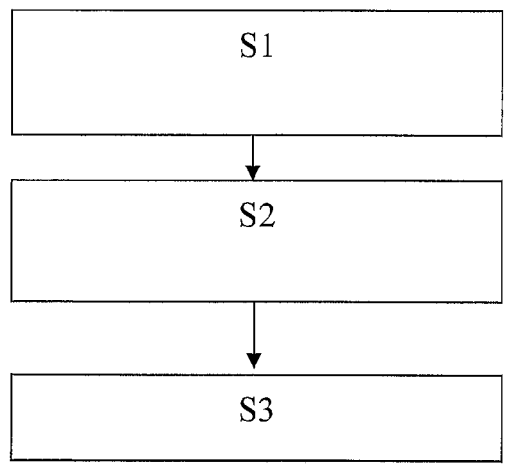
FIG. 4 shows a schematic representation of an inventive computer-based method of generating a control dataset for a layer-wise additive manufacturing apparatus.
Figure 5:
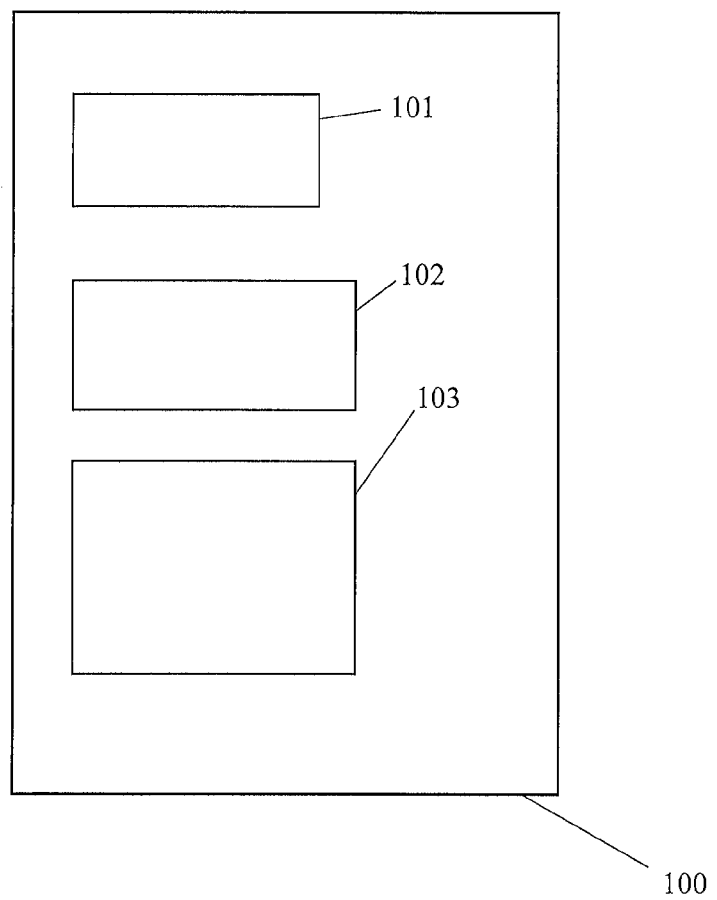
FIG. 5 shows the schematic setup of a device for generating a control dataset according to the present invention.

As shown in FIG. 5, an inventive device 100 for generating a control dataset for a specific layer-wise additive manufacturing apparatus contains an access unit 101, a specification unit 102 and a provision unit 103. The functioning of the device 100 for generating a control dataset will be described by making reference to FIG. 4. FIGS. 2 and 3 will serve for a further illustration.

Figure 12:
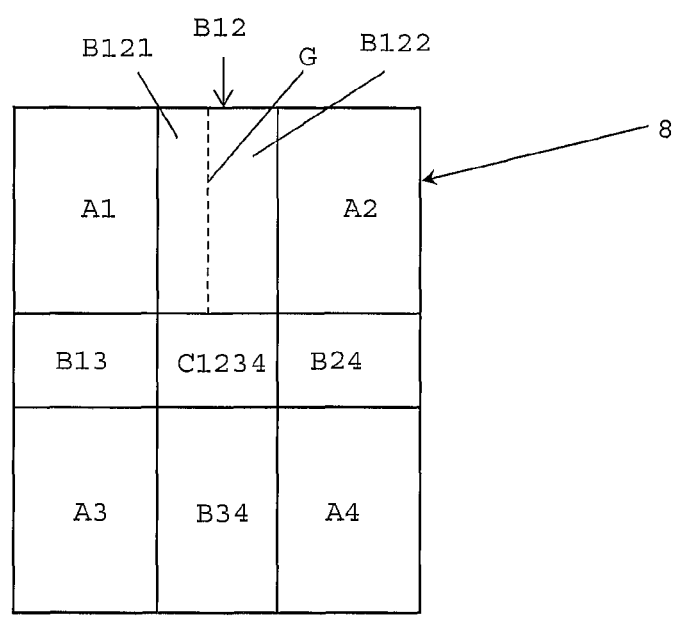
FIG. 12 shows a schematic top view of a construction field of a layer-wise additive manufacturing apparatus for explaining the approach when there are several solidification beams.

Here, FIGS. 2 and 3 each show a top view of a partial region of the construction field 8 of a layer-wise additive manufacturing apparatus, in which the operating areas of four solidification beams or beams, meaning the positions in the construction field onto which each of the solidification beams or beams can be directed, are shown. In analogy to FIG. 12, A designates those regions in which only one solidification beam, e.g. a laser beam, can be used for the solidification. The regions in which both solidification beams can be used jointly for the solidification are designated with B and the region in which four solidification beams can be jointly used for the solidification is designated with C.

In FIGS. 2 and 3 by way of example, a parallelogram-shaped object cross-section 55 of an object to be manufactured which parallelogram-shaped object cross-section is to be solidified during the manufacturing process in a layer k of the building material is shown. In this regard, FIGS. 2 and 3 each show a top view of the layer k of the building material.

In the inventive device 100 for generating a control dataset for a layer-wise additive manufacturing apparatus shown in FIG. 5, in order to carry out the inventive computer-based method in a first step an access unit 101 accesses a layer dataset of the object to be manufactured. In the process sequence shown in FIG. 4 this is step S1.

Here, the term "access" means that the access unit 101 reads a layer dataset from a memory or else that it receives the data corresponding to the layer dataset via a network. Similarly, the access unit can also access a memory in the device 100, in which the layer dataset is stored.

First of all, a layer dataset for the corresponding building material layer need only contain information on the positions of the building material layer at which a solidification of the building material shall be effected by directing beams onto the building material layer during the manufacturing of the object. Of course, further process information (e.g. layer thickness or beam diameter, etc.) can already be included.

As already mentioned in the introduction, the inventors have found that the number of beams (e.g. laser beams) that are used in a portion of an object cross-section for the solidification of the building material has an effect on the homogeneity of the object in this portion. The larger the number of beams used for the solidification, the worse will be the homogeneity in general, though, of course, the necessary length of time for the solidification of the portion (thus the manufacturing time) decreases with an increase of the number of beams. In a step S2 shown in FIG. 4, the specification unit 102 therefore modifies the layer dataset such that for at least a portion of the object cross-section the number of beams by means of which the building material within this portion is to be solidified is specified depending on specifications for a homogeneity of the portion and/or a manufacturing time of the object.

Here, FIGS. 2 and 3 show two possible results of the specification. For the sake of convenience it is here assumed that the portion for which the specification is made in step S2 comprises the whole object cross-section 55.

FIG. 2 illustrates the case in which a manufacturing time as short as possible was specified. One recognizes the operating areas 31, 32, 33, 34 of the four beams 1000, 2000, 3000, 4000. Thus, in order to achieve a small manufacturing time, four beams are jointly used for the solidification of the object cross-section 55. The operating areas are separated from one another by boundary regions 35, 36, 37, 38. In principle, the boundary regions are boundary lines. However, depending on the building material that is used and on the desired properties of the object to be manufactured, it may occur that operating areas of different beams do overlap in the solidification where they adjoin or else that gaps are generated between the operating areas. Due to this reason, the term "boundary region" was chosen in the present application. Moreover, at a sufficiently large magnification each real line may be regarded as region.

FIG. 3 illustrates the case in which a quite high precision has been specified for the object cross-section 55. Accordingly, it has been specified by the specification unit 102 that only two beams are used for the solidification of the object cross-section, though more beams would have been available. In FIG. 3, the operating areas 42 and 43 of the beams 2000 and 3000 can be recognized, which are separated from one another by the boundary region 45. Due to the presence of only one boundary region 45, in the object cross-section of FIG. 3 there are fewer inhomogeneities after the solidification compared to the case of FIG. 2.

Finally, in a step S3 shown in FIG. 4 the layer dataset that has been modified in step S2 is provided by the provision unit 103 to a layer-wise additive manufacturing apparatus as control dataset. As has been already mentioned further above, a control dataset may be regarded as subset of a control command set of a layer-wise additive manufacturing apparatus. Of course, a control dataset provided by the provision unit 103 can also be integrated into a control command set by the provision unit 103 itself. Apart from that, a provision also includes a transfer of the control dataset to a data processing device that integrates the control dataset into a control command set or a direct transfer to a layer-wise additive manufacturing apparatus. In particular, it is possible to dynamically provide control data for object cross-sections still to be manufactured to a layer-wise additive manufacturing apparatus during a manufacturing process in the layer-wise additive manufacturing apparatus.

Furthermore, for a layer-wise additive manufacturing process layer datasets that have been modified according to the invention need not be provided individually. Rather, several modified layer datasets may be collected at first and subsequently be provided in their entirety as control dataset.

Figure 6:
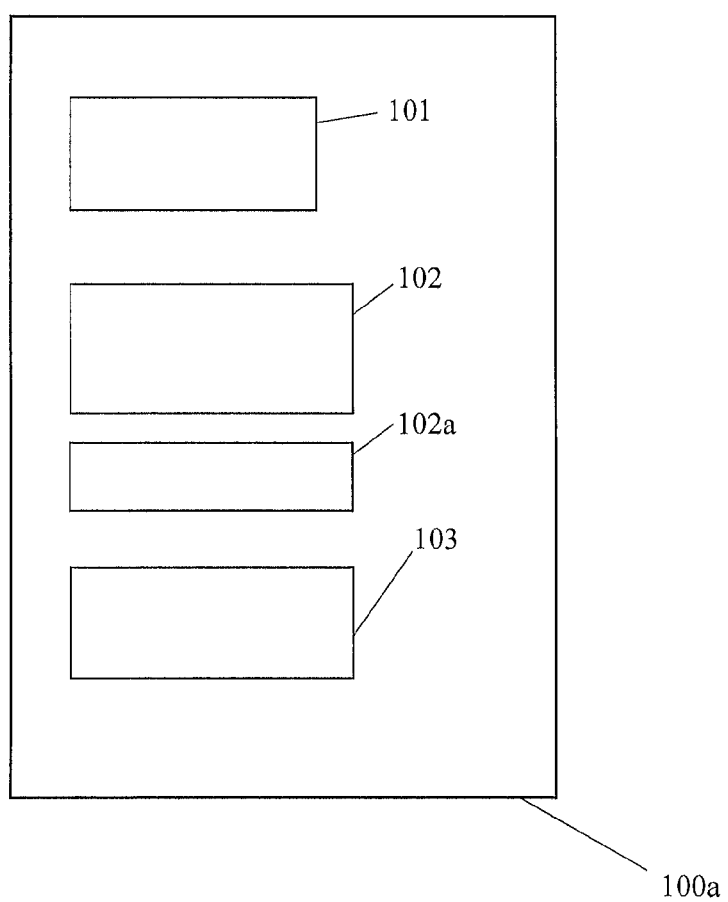
FIG. 6 shows the schematic setup of a modified device for generating a control dataset according to the present invention.
Figure 7:
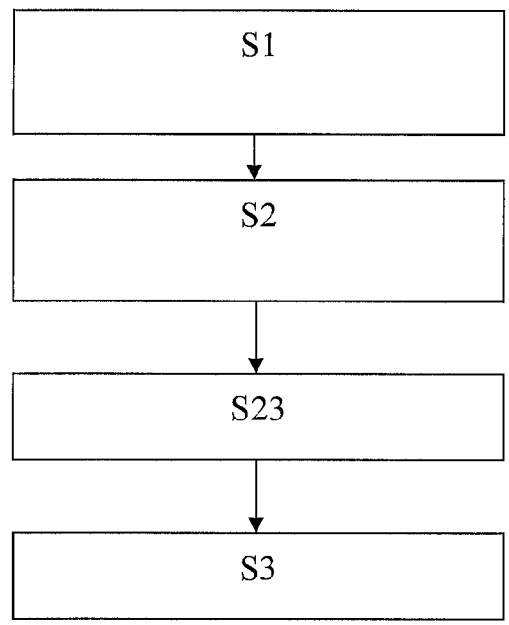
FIG. 7 shows a schematic representation of an inventive computer-based method for generating a control dataset by means of the modified device of FIG. 6.

FIG. 6 shows a modified inventive device 100a for a generation of a control dataset for a layer-wise additive manufacturing apparatus. FIG. 7 shows a correspondingly modified method. When the device in FIG. 6 is compared to the one in FIG. 5, an additional data modification unit 102a can be identified in FIG. 6. This carries out a step S23 illustrated in FIG. 7, in which the layer dataset is modified such that for each of the positions corresponding to the portion it is marked with which beam the building material is to be solidified at this position taking into consideration the specification according to the second step S2.

The specification unit 102 as it has been described above in the most general embodiment of the invention specifies in step S2 only the number of beams to be used for a solidification of the portion. However, in order to be able to carry out a manufacturing process in a layer-wise additive manufacturing apparatus, it is also necessary to specify which beam shall be directed to a position of a layer. This is already apparent from FIGS. 2 and 3 used for an illustration. For a simplified process in the manufacture it is advantageous, if this specification is made already in advance. This is done by the data modification unit 102a, which of course can also be integrated in the specification unit 102. Then the step S23 need not necessarily be carried out separately, but can be carried out also in the course of carrying out step S2.

Figure 8:
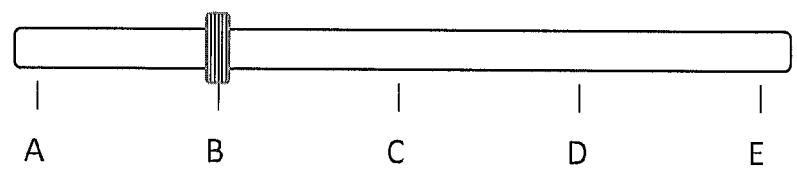
FIG. 8 shows an exemplary graphical control element for specifying a quality or homogeneity by a user.
Figure 9:
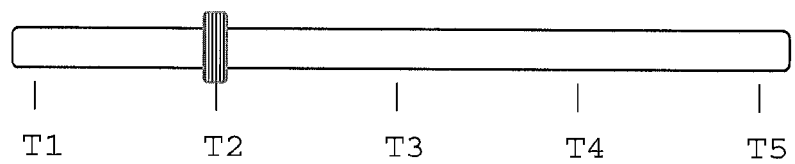
FIG. 9 shows an exemplary graphical control element for specifying a manufacturing time by a user.
Figure 10:
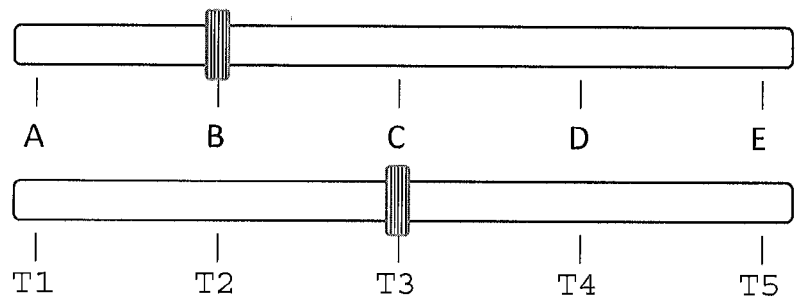
FIG. 10 shows an exemplary graphical control element for specifying a quality or homogeneity and a manufacturing time by a user.

In the explanation of the inventive approach, up to now it has not yet been described where the specifications for the homogeneity and/or manufacturing time for a portion of an object cross-section, for the whole object cross-section, for a partial region of the object or even for the complete object to be manufactured come from, on which specifications the specification unit 102 bases the number of beams to be used in the second step S2. Here, within the scope of the invention there are many possibilities. First and foremost it may be appropriate that the specifications are made by a user at a user interface, e.g. an input terminal having a graphical user interface. For example, a slider for specifying the homogeneity of a portion can be presented to the user (FIG. 8) or a slider for specifying the manufacturing time of a portion can be presented (FIG. 9). Of course, it is also possible to let the user make both specifications at the same time (FIG. 10).

The adjustments with respect to homogeneity and/or manufacturing time made by the user can e.g. be stored in a memory that is then accessed by the specification unit 102. In principle, it is possible that the specifications are steplessly made. However, it makes sense to offer the user discrete steps for the specification of the homogeneity and/or the manufacturing time as the possible number of beams to be used in the solidification of a portion also has discrete values. In the representations of FIG. 8 to FIG. 10 this has already been considered. For example, five discrete quality or homogeneity levels A, B, C, D, E and five discrete steps T1, T2, T3, T4, T5 for the manufacturing time can be seen in FIG. 8 to FIG. 10. Regarding the homogeneity levels, "A" may for example stand for a very high homogeneity, "E" for a low homogeneity and "B" to "D" for medium homogeneity levels, wherein an order relation has been predefined for the set of predetermined homogeneity levels and the homogeneity levels are different from one another. The same applies for the predefined manufacturing times "T1" to "T5". By the way, only in this specific example there is the same number of steps for the homogeneity and the manufacturing time. The number of steps for the homogeneity can also be different from the number of steps for the specification of the manufacturing time. Furthermore, further sliders may be elements of the graphical user interface by which a user may select and adjust separately from one another, respectively, or specify also other object properties such as those listed further above where the term "quality" was explained.

The specification by the specification unit 102 of the number of beams to be used preferably is made depending on pre-tests at a layer-wise additive manufacturing apparatus of the same type as the one by which the manufacturing of the object is planned. Ideally, the portions of similar objects have been solidified in pre-tests with differing numbers of beams and have been analyzed with respect to the achieved homogeneity and the needed manufacturing time. If such specific information is missing, the approach of the specification unit 102 can also be based on the experience of the skilled person in the layer-wise additive manufacturing of objects. In particular, it is also possible to simulate the manufacturing process and to specify the number of beams to be used for particular specifications on the basis of the simulation. In each case, one can say that the results of the pre-tests or simulations or even empirical values exist in such a form that they can be retrieved by the specification unit 102, for example in the form of a table stored in a memory that gives a relation between the number of beams to be used and the specified quality or homogeneity level and/or the manufacturing time. Basically one can say that when a homogeneity level is specified that is as small as possible and/or a manufacturing time is specified that is as small as possible, the specification unit 102 usually will specify the maximum possible number of beams and when a homogeneity level is specified that is as high as possible and/or a manufacturing time is specified that is as long as possible, the specification unit 102 usually will specify a solidification with only one beam. In the preferred case that the number of predefined homogeneity levels and/or the number of predefined steps for the manufacturing time equals the maximum number of beams that are available for the solidification of a portion of an object cross-section or a total object cross-section, there may also merely be made a bijective assignment of predefined steps and numbers of beams to be used, in which assignment the number of beams to be used is inversely proportional to the specified level for the homogeneity and/or the manufacturing time.

If the user only specifies the manufacturing time or only specifies the desired homogeneity, optionally the inventive device 100 or 100a for generating a control dataset can output to the user a manufacturing time to be expected (in the case of the specification of the homogeneity) or a homogeneity to be expected (in the case of the specification of the manufacturing time) before the actual generation of the control dataset. The user thereby gets the opportunity to change his/her specification. For such an approach it is e.g. at first determined with which number of beams the solidification must be carried out for complying with the specified (maximum) manufacturing time or for being able to achieve the specified homogeneity. Then, based on the number of beams to be jointly used for the solidification of a portion an estimation of the homogeneity to be expected is made and a homogeneity level resulting from the estimation is output to the user or an estimation of the manufacturing time to be expected is made and a manufacturing time (level) resulting from the estimation is output to the user.

If a user specifies the homogeneity as well as the manufacturing time, optionally the incompatibility of his specifications can be displayed to the user. For example, a high homogeneity and a small manufacturing time together could not be implementable. Here, it can be at first determined with which number of beams the solidification must be carried out in order to be able to comply with the specified (maximum) manufacturing time and then it can be determined with which number of beams the specified homogeneity can be obtained. In case the obtained values are incompatible with one another, this can be communicated to the user.

Even if in FIGS. 8 to 10 only sliders are shown as graphical setting elements for the specification of a quality or homogeneity and/or manufacturing time, of course a user can make the specifications also via other graphical control elements (widgets), e.g. check boxes and option buttons, respectively, in a menu, etc.

It is also possible not to let a user make specifications for the homogeneity but to automatically determine the necessary homogeneity in the manufacture. This can be made as follows:

Depending on the type of building material (e.g. grain size distribution for powders) or the way in which the radiation is supplied to the same for a solidification, the solidification performance (e.g. a melt pool diameter) of the same will change. From a shape of an object cross-section, in particular also a detail resolution with which this object cross-section is characterized in a layer dataset, it can be deduced in view of the material and in view of the solidification performance predetermined by the solidification conditions, whether the detail resolution can be completely realized in the manufacture. However, from this it can be estimated which object quality is realizable at all and this homogeneity can be used as parameter for the specification of the number of beams to be used.

Though in FIGS. 2 and 3 in particular the conditions inside of an object cross-section were illustrated, the present invention can also be applied to portions of an object cross-section that lie in the contour of the object cross-section. This case is illustrated in FIG. 11.

Figure 11:
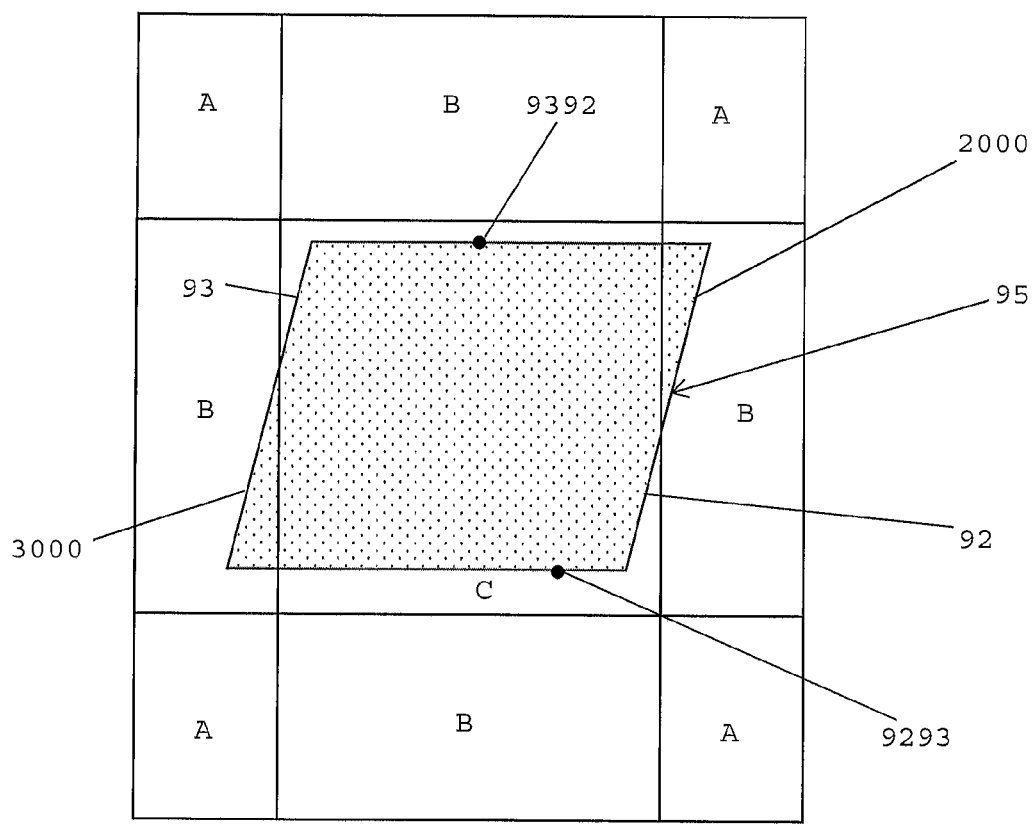
FIG. 11 shows a schematic top view of a partial region of a construction field of a layer-wise additive manufacturing apparatus for explaining the approach according to the invention for the contour region.

The representation in FIG. 11 is similar to the ones of FIGS. 2 and 3 and illustrates an object cross-section 95 in a layer k. Different from FIGS. 2 and 3, in FIG. 11 not the complete object cross-section 95 is regarded as portion for which a specification has to be made, but only the contour of this object cross-section. FIG. 11 shows an exemplary result of a specification by the specification unit 102, according to which the contour region (edge) of the object cross-section 95 is solidified by two beams 2000 and 3000 each of which solidifies a partial portion 92 and 93, respectively, of the contour region. (Usually, a contour region is solidified such that the solidification beam that is used, which has a certain diameter where it impinges onto the building material, moves along the contour. Therefore, it is admissible to denominate parts of the contour of an object cross-section as two-dimensional regions.) Like in the inside of an object cross-section, where two operating areas of beams adjoin, also in the contour region it applies that two operating areas usually will not adjoin exactly, but there will be a small gap or a small overlap at the boundary. Therefore, also the two boundary positions 9392 and 9293 in FIG. 11 are designated as boundary regions.

Like in the inside of an object cross-section, also in the contour region a worse quality or homogeneity has to be expected the more boundary positions exist between the different operating areas of the beams. Therefore, all statements made above in conjunction with the inside of an object cross-section in the same way do apply to the contour region where in particular also often the optical quality of the surfaces is of importance.

Finally, it shall be mentioned that an inventive device for generating a control dataset of a layer-wise additive manufacturing apparatus can be implemented not only by software components but also exclusively by hardware components or mixtures from hardware and software. In particular, interfaces that are mentioned in the present application need not necessarily be configured to be hardware components, but can also be implemented as software modules, for example when the data that are input or output via the same can be taken over from other components that are implemented in the same device or need to be transferred to another component only by software. Also, the interfaces could consist of hardware components and software components, such as a standard hardware interface that is specifically configured by software for a specific application. Furthermore, a plurality of interfaces can be combined into a common interface such as an input-output interface.

What is claimed:

1. A computer-based method of generating a control dataset for a layer-wise additive manufacturing apparatus for manufacturing a three-dimensional object, wherein the additive manufacturing apparatus manufactures the three dimensional object layer by layer by directing a plurality of beams onto areas of a layer of building material that correspond to an object cross-section, an input device configured to direct the plurality of beams to different regions of the layer, each of the beams acting on the building material where the beam impinges on the layer, wherein the method of generating theft control dataset comprises:

a first step of accessing a layer dataset containing a data model of the layer to be selectively solidified, wherein in the data model positions corresponding to the object cross-section are marked as positions at which a solidification of the building material will be carried out;

a second step of modifying the layer dataset to specify the number of beams to solidify the building material within the portion depending on specifications for a homogeneity of the portion or a homogeneity of the manufactured three-dimensional object and/or on a manufacturing time for the three-dimensional object, wherein the number of beams used is decreased to achieve a larger homogeneity of the portion of the three-dimensional object, and the number of beams used is increased to lower the manufacturing time for the three-dimensional object; and a third step of providing the modified layer dataset as the control dataset for the additive manufacturing apparatus.

2. The method of claim 1, further comprising, between the second and third step, modifying the layer dataset by specifying which of the plurality of beams are to solidify the building material at each of the positions.

3. The method of claim 1, wherein in the second step specifying n beams to simultaneously solidify building material, wherein n is a natural number larger than one.

4. The method of claim 1, further comprising receiving input of the homogeneity of the portion and/or the manufacturing time of the three-dimensional object by a user input at an input terminal.

5. The method of claim 4, wherein the step of receiving includes receiving one of n predefined successive quality levels by the user input at the input terminal.

6. The method of claim 5, wherein in the second step, modifying the layer dataset to specify only one of the beams to solidify the building material for the user input of the highest quality level; and/or in the second step, modifying the layer dataset to specify a maximum number of available beams to solidify the building material for the user input of a lowest quality level; and/or in the second step, modifying the layer dataset to specify a number of beams that is larger than one and smaller than the maximum number of beams to solidify the building material for the user input of a medium quality level, wherein consistently for a higher quality level the respective number of beams to be used is smaller or a same number than a number of beams to be used for a lower quality level.

7. The method of claim 4, wherein the step of receiving includes receiving the manufacturing the three-dimensional object; and outputting an error message to the user if the homogeneity and the manufacturing time input into the user terminal are incompatible with one another.

8. The method of claim 1, wherein specifications for the homogeneity of the three-dimensional object to be manufactured are derived from information contained in the layer dataset including a shape of individual object cross-sections and/or a way in which radiation is supplied to the building material and/or a type and/or a composition of the building material.

9. The method of claim 1, wherein in the second step specifications for a portion of the three-dimensional object to be manufactured are taken into consideration.

10. The method of claim 1, wherein a user only specifies a manufacturing time for manufacturing the three-dimensional object; and outputting a quality level to be expected for the object to the user, the quality level obtained for within the specified manufacturing time.

11. The method of claim 1, further comprising specifying partial regions of the portion that are to be solidified, and specifying with which of the beams the partial regions are to be solidified; and wherein the partial regions are specified such that a boundary located at the boundary between different partial regions differs in shape and/or position in a layer plane from a shape and/or a position of the boundary region in an immediately preceding or immediately following layer.

12. The method of claim 1, further comprising a step of manufacturing at least one three-dimensional object by the layer-wise additive manufacturing apparatus using the generated control dataset.

13. The method of claim 12, wherein the control dataset is generated during the step of manufacturing the three-dimensional object.

* * * * *